United States Patent [19]
Matsumoto et al.

[11] Patent Number: 6,157,588
[45] Date of Patent: *Dec. 5, 2000

[54] SEMICONDUCTOR MEMORY DEVICE HAVING HIERARCHICAL WORD LINE STRUCTURE

[75] Inventors: Yasuhiro Matsumoto; Mikio Asakura; Takeshi Hamamoto; Kei Hamade, all of Hyogo, Japan

[73] Assignee: Mitsubishi Denki Kabushiki Kaisha, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 09/229,343

[22] Filed: Jan. 13, 1999

[30] Foreign Application Priority Data

Jul. 29, 1998 [JP] Japan .................................. 10-214150

[51] Int. Cl.[7] ..................................................... G11C 7/02
[52] U.S. Cl. .............................. 365/214; 365/206; 365/51; 365/63
[58] Field of Search .................................. 365/51, 63, 72, 365/206, 214, 230.06

[56] References Cited

U.S. PATENT DOCUMENTS

| | | | |
|---|---|---|---|
| 5,715,189 | 2/1998 | Asakura | 365/72 |
| 5,793,664 | 8/1998 | Nagata et al. | 365/72 |
| 5,875,149 | 2/1999 | Oh et al. | 365/230.06 |

FOREIGN PATENT DOCUMENTS 5-167030  7/1993  Japan .

*Primary Examiner*—Son Mai
*Attorney, Agent, or Firm*—McDermott, Will & Emery

[57] ABSTRACT

First and second global input/output lines are twisted between first and second main blocks. First and second SD signal lines in the first main block are respectively arranged adjacent to first and second global input/output lines. First and second SD signal lines in the second main block are respectively arranged adjacent to the second and first global input/output lines. An SD signal supplied for the first or second SD signal line makes noises applied to the first and second global input/output lines identical, so that an influence by the noises is substantially eliminated between the first and second global input/output lines. As a result, the global input/output line is provided with higher resistance to noise without any increase in a layout area.

7 Claims, 8 Drawing Sheets

FIG.6

SEMICONDUCTOR MEMORY DEVICE HAVING HIERARCHICAL WORD LINE STRUCTURE

BACKGROUND OF THE INVENTION

1. Field of the Invention

The present invention relates to semiconductor memory devices, and more specifically, to a semiconductor memory device having a hierarchical word line structure.

2. Description of the Background Art

Related Art 1

With recent increase in storage capacity of semiconductor memory devices, a semiconductor memory device called a DRAM (a Dynamic Random Access Memory) has an input/output line for data in a hierarchical structure having global and local input/output lines in order to achieve high speed operation. In such DRAM, a noise may be introduced to the global input/output line from a signal line which is arranged adjacent thereto, thereby destroying a data signal on the global input/output line. To avoid such problem, a shield line can be arranged adjacent to the global input/output line.

Related Art 2

A DRAM shown in FIG. 11 has a structure in which two input/output line pairs IOPa and IOPb are arranged adjacent to each other. In the DRAM, to column selection gates CSGA and CSGB are simultaneously activated by one column selection line CSL. Thus, even when a data is externally written to a memory cell MCA, a data signal in a memory cell MCB is temporarily read onto a input/output line pair IOPb and again written to memory cell MCB.

Problem Associated With Related Art 1

If the shield line is arranged adjacent to the global input/output line, a layout area increases.

Problem Associated With Related Art 2

When the data signal is written to memory cell MCA, a strong write signal is supplied for a input/output line pair IOPa by a write driver. The data signal for memory cell MCB which has been read onto a input/output line pair IOPb may be inverted by the write signal. Further, the inverted data signal is again be written to memory cell MCB, thereby destroying data.

SUMMARY OF THE INVENTION

An object of the present invention is to provide a semiconductor memory device which allows increase in resistance to noise of a global input/output line without any increase in a layout area.

Another object of the present invention is to provide a semiconductor memory device in which a data signal for one of adjacent two input/output line pairs may not destroy a data signal for the other of the input/output line pairs.

A semiconductor memory device according to one aspect of the present invention includes first and second main blocks and first and second global input/output lines. The first global input/output line is arranged to traverse the first and second main blocks. The second global input/output line is arranged adjacent to the first global input/output line and is in a complementary relation with the first global input/output line. Each of the first and second main blocks includes a plurality of sub blocks, a plurality of main word lines, a local input/output line pair and a transfer gate. The plurality of main word lines are arranged longitudinally across the plurality of sub blocks. The transfer gate is connected between the local input/output line pair and the first and second global input/output lines. Each of the plurality of sub blocks includes a plurality of memory cells, a plurality of sub word lines, a plurality of sub word line drivers, a plurality of bit line pairs and a plurality of column selection gates. The plurality of memory cells are arranged in rows and columns. The plurality of sub word lines are arranged corresponding to the plurality of main word lines and in rows. The plurality of sub word line drivers drive the plurality of sub word lines. The plurality of bit lines pairs are arranged in columns. The plurality of column selection gates are arranged corresponding to the plurality of bit line pairs and each connected between corresponding bit line pair and the local input/output line pair. The semiconductor memory device further includes a row decoder. The row decoder simultaneously selects one of the plurality of main word lines included in the first main block and one of the plurality of main word lines included in the second main block. At least one sub block included in the first main block further includes a first activation signal line. The first activation signal line is arranged adjacent to the first global input/output line and transmits a signal for activating the sub word line driver. At least one sub block included in the second main block further includes a second activation signal line. The second activation signal line is arranged adjacent to the second global input/output line and transmits a signal for activating the sub word line driver.

In the above described semiconductor memory device, the row decoder simultaneously selects one of the plurality of main word lines included the first main block and that in the second main block. Responsively, a signal for activating the sub word line driver for driving the sub word line which corresponds to the memory cell to be accessed is supplied for the corresponding sub word line driver through the first and second activation signal lines. At the time, the first and second global input/output lines receive noises by signals supplied for the first and second activation signal lines, respectively. However, as the noises for the first and second global input/output lines are the same in strength and timing (noises having such characteristics are hereinafter referred to as "identical noises), influence by the noises is substantially eliminated between the first and second global input/output lines. In addition, as the first and second activation signal lines are respectively arranged adjacent to the first and second global input/output lines, the first and second global input/output lines are shielded from a noise generated from a signal line other than the first and second activation signal lines. As a result, the first and second global input/output lines are provided with a higher resistance to noise without any increase in a layout area.

A semiconductor memory device according to another aspect of the present invention is capable of switching between a first word configuration and a second word configuration which is shorter than the first word configuration, and includes a plurality of data input/output terminals and a plurality of data input/output line pairs. The plurality of data input/output line pairs are arranged corresponding to the plurality of data input/output terminals. Two data input/output line pairs of the plurality of data input/output line pairs are adjacent to each other. The semiconductor memory device further includes a word configuration switching circuit. The word configuration switching circuit connects each of the data input/output line pairs to the corresponding data input/output terminal in the case of the first word configuration, and connects each of the two data input/output line pairs, which are adjacent to each other, to one of the data input/output terminals in the case of the word configuration.

In the semiconductor memory device, in the case of the word configuration, each of the plurality of data input/output line pairs is connected to the corresponding data input/output terminal, so that a data signal is transmitted therebetween. In the case of the second word configuration, two adjacent data input/output line pairs of the plurality of data input/output line pairs are both connected to or not connected to the data input/output terminals. As a result, a data signal for one of the two adjacent input/output line pairs may not destroy a data signal on the other of the input/output line pairs.

Preferably, the semiconductor memory device further includes a mask circuit. The mask circuit is connected between the data input/output terminal and the word configuration switching circuit for simultaneously masking the data signal to be transmitted between the two adjacent data input/output line pairs and the corresponding two data input/output terminals.

In the semiconductor memory device, each of the two adjacent data input/output line pairs of the plurality of data input/output line pairs are both connected to the data input/output terminals or both masked. As a result, the data signal for one of the two adjacent input/output line pairs may not destroy the data signal on the other of the input/output line pairs.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 6 is a block diagram showing an overall structure of a DRAM according to a second embodiment of the present invention.

DESCRIPTION OF THE PREFERRED EMBODIMENTS

Figure 1:
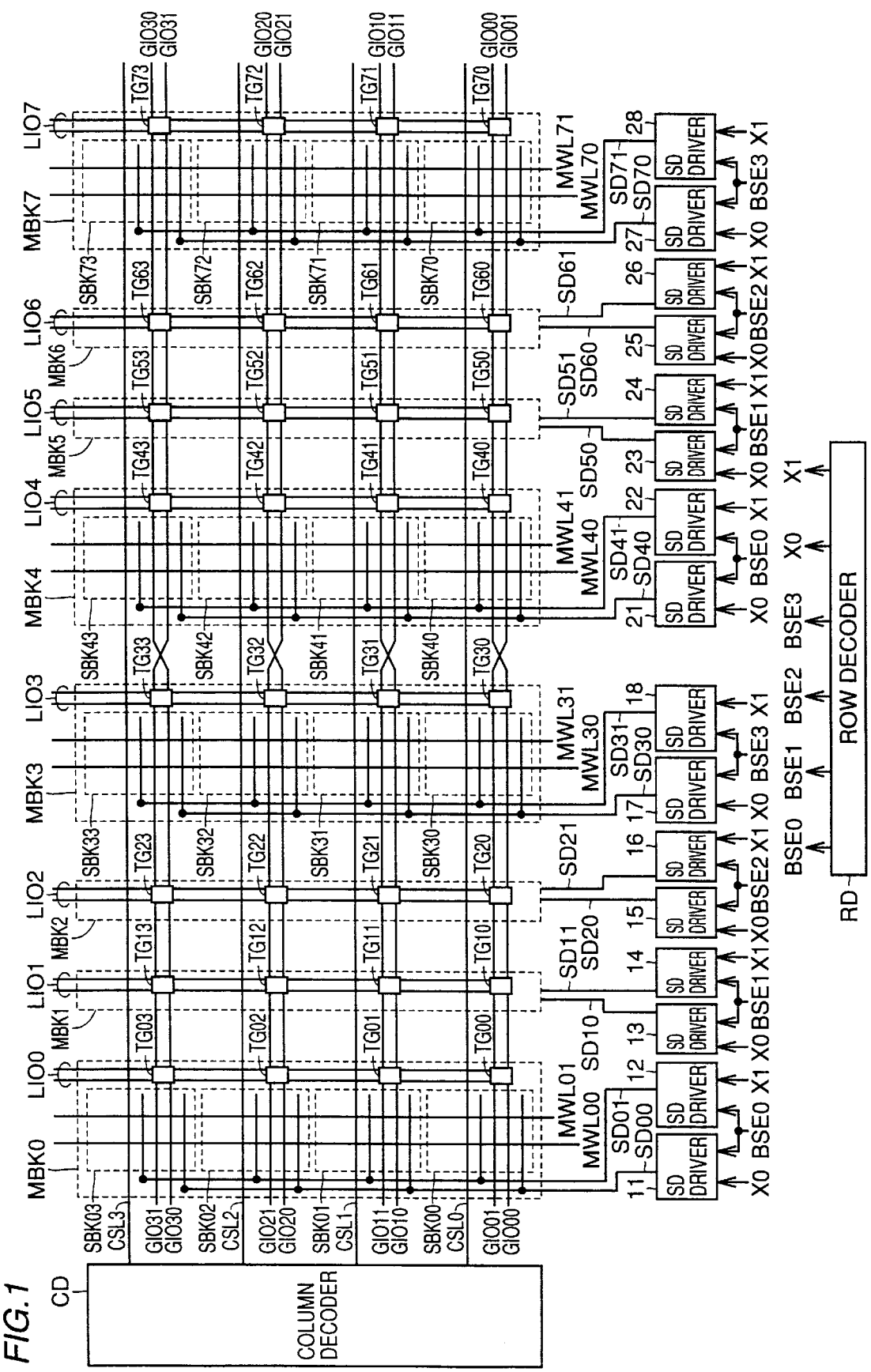
FIG. 1 is a block diagram showing an overall structure of a DRAM according to a first embodiment of the present invention.

Embodiments of the present invention will now be described in detail with reference to the drawings. It is noted that the same or corresponding portions in the drawings are denoted by the same reference characters, and therefore the description thereof will not be repeated.

First Embodiment

Referring to FIG. 1, a DRAM includes main blocks MBKi (i=0–7), global input/output lines GIOj0, GIOj1(j=0–3), a row decoder RD, a column decoder CD, column selection lines CSLj (j=0–3) and SD drivers 11 to 18 and 21 to 28.

Each of main blocks MBKi (i=0–7) includes sub blocks SBKij (i=0–7, j=0–3), main word lines MWLi0, MWLi1 (i=0–7), local input/output line pairs LIOi (i=0–7) and transfer gates TGij (i=0–7, j=0–3). Each of sub blocks SBKij (i=0–7, j=0–3) includes SD signal lines SDi0 and SDi1 (i=0–7). SD signal lines SDi0 (i=0–3) and SDi1 (i=4–7) are arranged adjacent to global input/output lines GIOj0 (j=0–3). SD signal lines SDi0 (i=4–7), and SDi1 (i=0–3) are arranged adjacent to global input/output lines GIOj1 (j=0–3). Main word lines MWLi0 and MWLi1 (i=0–7) are arranged longitudinally across sub blocks SBKi0 to SBKi3.

It is noted that although sub blocks SBK00 to SBK03, SBK30 to SBK33, SBK40 to SBK43 and SBK70 to SBK73 are shown in FIG. 1, sub blocks SBK10 to SBK13, SBK20 to SBK23, SBK50 to SBK53 and SBK60 to SBK63 are similarly provided.

Local input/output line pairs LIOi (i=0–7) are connected to global input/output lines GIOj0 and GIOj1 through transfer gates TGij (i=0–7, j=0–3). Transfer gates TGij (i=0–7, j=0–3) are connected between local input/output line pairs LIOi (i=0–7) and global input/output lines GIOj0 and GIOj1, turned on/off in response to row and column address signals, and connect/disconnect local input/output line pairs LIOi (i=0–7) and global input/output lines GIOj0 and GIOj1.

Global input/output lines GIOj0 and GIOj1 (j=0–3) are arranged to traverse sub blocks SBKij (i=0–7, j=0–3), being twisted between main blocks MBK3 and MBK4.

Row decoder RD generates block selection signals BSE0 to BSE3 and address signals X0 and X1 in response to a row address signal, and selects main word lines MWLi0 and MWLi1 (i=0–7) in response to the row address signal.

Column decoder CD selectively activates column selection lines CSLj (j=0–3) in response to a column address signal.

Column selection lines CSLj (j=0–3) are arranged to traverse sub blocks SBKij (i=0–7, j=0–3).

SD drivers 11 to 18 and 21 to 28 supply SD signals for driving sub word line drivers (later described) for corresponding SD signal lines SDi0 and SDi1 (i=0–7) in response to corresponding block selection signals BSE0 to BSE3 and address signals X0 and X1.

Figure 2:
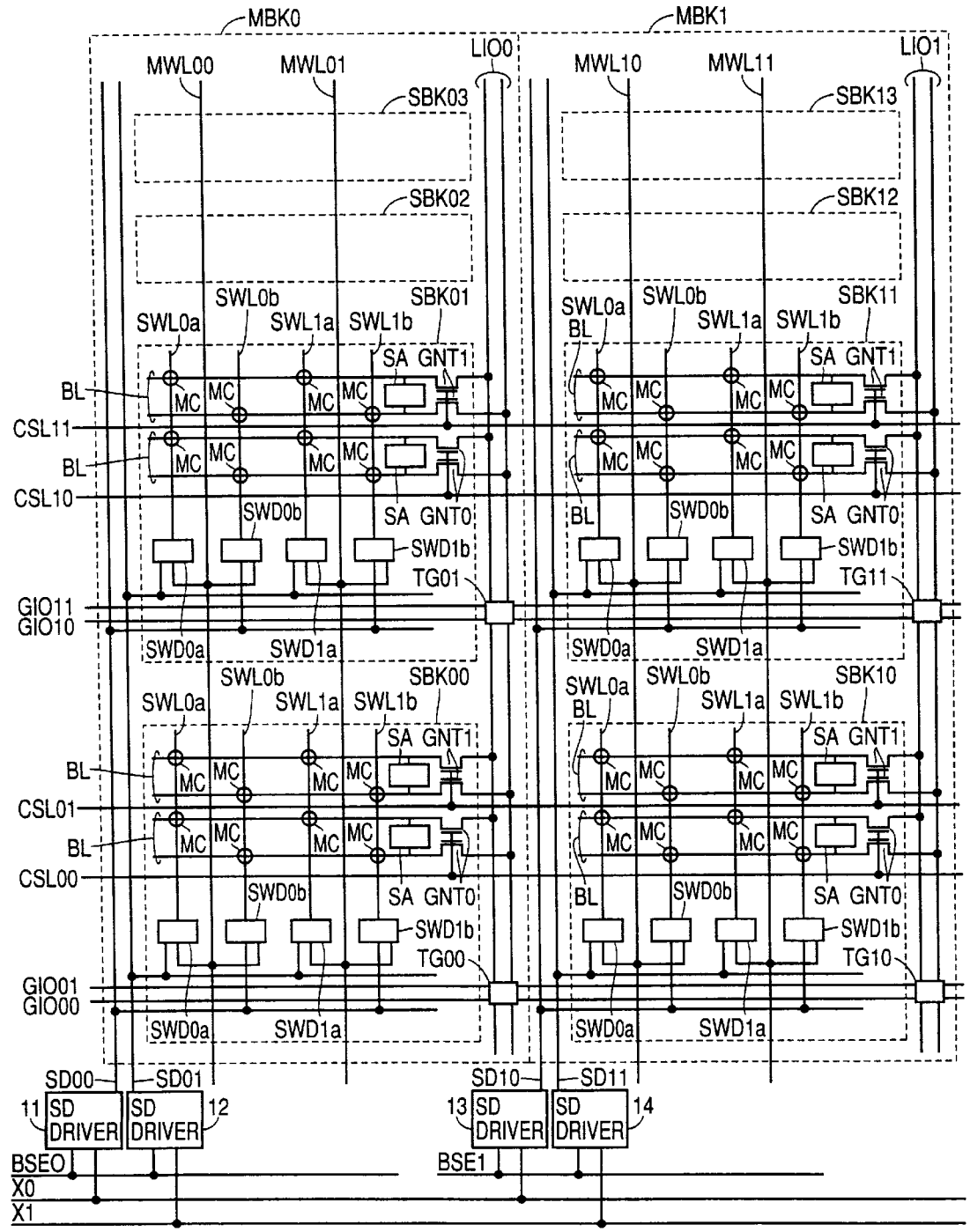
FIG. 2 is a block diagram showing a structure of a sub block shown in FIG. 1.

FIG. 2 is a block diagram showing in detail structures of sub blocks SBKij (i=0–1, j=0–1) of sub blocks SBKij (i=0–7, j=0–3) shown in FIG. 1.

Referring to FIG. 2, sub block SBK00 includes: a plurality of memory cells MC arranged in rows and columns; sub word lines SWL0a, SWL0b, SWL1a and SWL1b arranged in rows; a plurality of bit line pairs BL arranged in columns; a plurality of sense amplifiers SA; a plurality of N channel MOS transistors GNT0 and GNT1; and sub word line drivers SWD0a, SWD0b, SWD1a and SWD1b. Sub word lines SWL0a and SWL0b are arranged corresponding to a main word line MWL00. Sub word lines SWL1a and SWL1b are arranged corresponding to a main word line MWL01. Each of a plurality of sense amplifiers SA amplifies a potential difference between the corresponding bit line pair BL. Each of N channel MOS transistor GNT0 and GNT1 forms a column selection gate, is connected between corresponding bit line pair BL and a local input/output line pair LIO0, and turned on/off in response to a column selection signal of corresponding column selection lines CSL00 and CSL01. Sub word line driver SWD0a activates sub word line SWL0a in response to a voltage of main word line MWL00 and an SD signal supplied for SD signal line SD01. Sub word line driver SWD0b activates sub word line SWL0b in response to the voltage of main word line MWL00 and the SD signal supplied for SD signal line SD00. Sub word line driver SWD1a activates a sub word line SWL1a in response to a voltage of main word line MWL01 and the SD signal supplied for SD signal line SD01. Sub word line driver SWD1b activates a sub word line SWL1b in response to the voltage of main word line MWL01 and the SD signal supplied for SD signal line SD00.

Sub blocks SBK01, SBK10 and SBK11 have structures similar to that of the above mentioned sub block SBK00. Further, sub blocks SBK02, SBK03 and SBK12, SBK13 respectively included in main blocks MBK0 and MBK1 also have similar structures. Each of main blocks MBK2 to MBK7 includes sub blocks SBKij (i=2–7, j=0–3) each having a structure similar to that of sub block SBK00.

Figure 3:
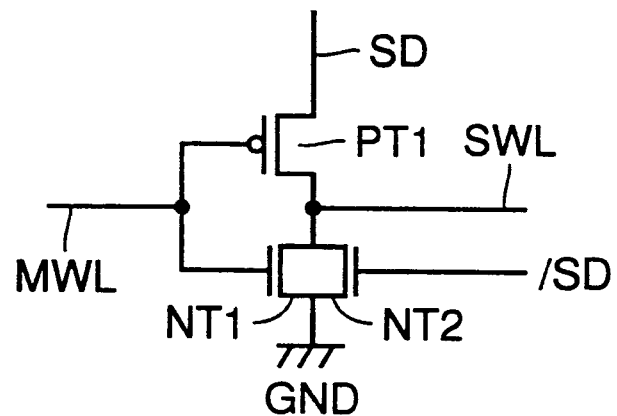
FIG. 3 is a circuit diagram showing a structure of a sub word line driver shown in FIG. 2.

FIG. 3 is a circuit diagram showing a structure for sub block line drivers SWD0a, SWD0b, SWD1a and SWD1b shown in FIG. 2. Referring to FIG. 3, each of sub word line drivers SWD0a, SWD0b, SWD1a and SWD1b includes a P channel MOS transistor PT1 and N channel MOS transistors NT1 and NT2. P channel MOS transistor PT1 is connected between corresponding SD signal line SD and sub word line SWL and having its gate receiving the voltage of corresponding main word line MWL. N channel MOS transistor NT1 is connected between corresponding sub word line SWL and a ground node GND and having its gate receiving the voltage of corresponding main word line MWL. N channel MOS transistor NT2 is connected in parallel with N channel MOS transistor NT1 between corresponding sub word line SWL and ground node GND and having its gate receiving an inverted voltage /SD of a voltage of corresponding SD signal line SD.

Operations of sub word line drivers SWD0a, SWD0b, SWD1a and SWD1b each having the above mentioned structure will now be described in connection with sub word line driver SWD0a included in main block MBK0.

When main word line MWL00 is not selected by row decoder RD shown in FIG. 1, the voltage of main word line MWL00 attains to an H level. Thus, P channel and a N channel MOS transistors PT1 and NT1 are respectively turned off and on. Therefore, a voltage of sub word line SWL0a attains to an L level regardless of a voltage of SD signal line SD01. On the other hand, when main word line MWL00 is selected by row decoder RD, the voltage of main word line MWL00 attains to the L level. Thus, P channel and N channel MOS transistors PT1 and NT1 are respectively turned on and off. As SD signal line SD01 is at the L level when the SD signal is not supplied for SD signal line SD01, N channel MOS transistor NT2 is turned on and the voltage of sub word line SWL0a attains to the L level. As SD signal line SD01 attains to the H level when the SD signal is supplied for SD signal line SD01, N channel MOS transistor NT2 is turned off and the voltage of sub word line SWL0a attains to the H level.

It is noted that the operations of sub word line driver SWD0a included in main blocks and sub word line drivers SWD0b, SWD1a and SWD1b included in main blocks MBK0 to MBK7 are similar to the above described operation of sub word line driver SWD0a included in main block MBK0.

Figure 4:
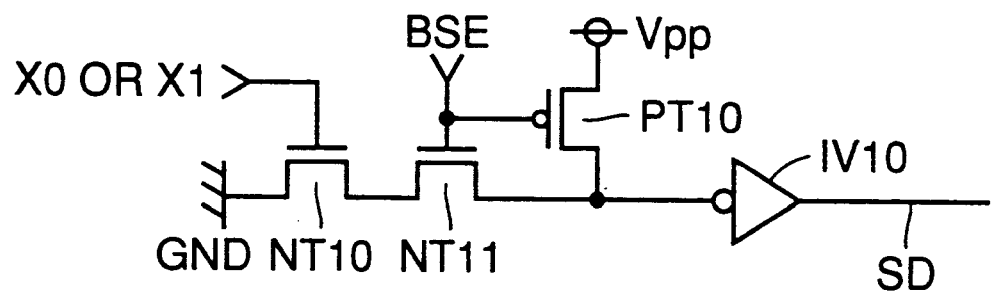
FIG. 4 is a block diagram showing a structure of an SD driver shown in FIG. 1.

FIG. 4 is a diagram showing a structure of each of SD drivers 11 to 18 and 21 to 28 in FIG. 1. Referring to FIG. 4, each of SD drivers 11 to 18 and 21 to 28 includes an N channel MOS transistors NT10 and NT11, a P channel MOS transistors PT10 and an inverter IV10.

N channel MOS transistor NT10 is connected between N channel MOS transistor NT 11 and ground node GND and having its gate receiving corresponding address signal X0 or X1. N channel MOS transistor NT11 is connected between an input terminal of inverter IV10 and N channel MOS transistor NT10 and having its gate receiving corresponding block selection signal BSE. P channel MOS transistor PT10 is connected between an interconnection node of N channel MOS transistor NT11 and inverter IV10 and a boosting node Vpp and having its gate receiving corresponding block selection signal BSE.

It is noted that boosting node Vpp is charged to a voltage Vpp which is higher than a power supply voltage. Inverter IV10 is connected between boosting node Vpp and ground node GND for inverting a voltage of an interconnection node of P channel MOS transistor PT10 and N channel MOS transistor NT11 and supplying it for the corresponding SD signal line SD.

Operations of SD drivers 11 to 18 and 21 to 28 having above mentioned structures will now described in connection with SD driver 11.

When main block MBK0 is not selected by row decoder RD shown in FIG. 1, block selection signal BSE0 attains to the L level. At the time, P channel and N channel MOS transistors PT10 and NT11 are respectively turned on and off. Thus, an input to inverter IV10 attains to the H level, so that a voltage of SD signal line SD00 attains to the L level.

When main block MBK0 is selected by row decoder RD, block selection signal BSE0 attains to the H level. At the time, P channel and N channel MOS transistors PT10 and NT11 are respectively turned off and on. Further, when address signal X0 from row decoder RD attains to the H level, N channel MOS transistor NT10 is turned on. Thus, the voltage of SD signal line SD00 attains to the H level as the input to inverter IV10 attains to the L level. The voltage of SD signal line SD00 at the H level turns to a signal for driving sub word line driver SWD0a. It is noted that the H level of SD signal line SD00 at the time corresponds to a voltage Vpp level which is higher than the power supply voltage. Accordingly, the H level of the above mentioned sub word line SWL0a also corresponds to the voltage Vpp level which is higher than the power supply voltage.

An operation of the DRAM thus structured will now be described.

Main word lines MWL00 and MWL40 respectively included in main blocks MBK0 and MBK4 are simultaneously selected by row decoder RD, and the levels of voltages of main word lines MWL00 and MWL40 change from H to L. In addition, the levels of block selection signal BSE0 and address signal X1 change from L to H and, responsively, the SD signals at the H level are simultaneously supplied from SD drivers 12 and 22 for SD signal lines SD01 and SD41, respectively.

By the voltage change of SD signal line SD01 at the time, adjacent global input/output lines GIOj1 (j=0–3) receive noises. Similarly, by the voltage change of SD signal line SD41, adjacent global input/output lines GIOj1 (j=0–3) also receive noises. However, as the voltages of SD signal lines SD01 and SD41 simultaneously change, global input/output lines GIOj0 (j=0–3) and GIOj1 (j=0–3) receive identical noises. Thus, a global input/output line pair GIOj0 and GIOj1 (j=0–3) are not affected by the noises. As a result, a data signal transmitted as a potential difference between global input/output lines GIOj0 and GIOj1 (j=0–3) is not affected by the noises.

It is noted that although the address signal X1 has been described as attaining to the H level, when address signal X0 attains to the H level, an effect similar to that described above can be obtained for SD signal lines SD00 and SD40.

Sub word line drivers SWD0a included in main blocks MBK0 and MBK4 boost sub word lines SWL0a to the H level (Vpp level) in response to the voltages of main word lines MWL00 and MWL40 and the SD signal at the H level.

Then, the column selection line corresponding to the column address is selected by column decoder CD (here, assume that CSL00 is selected).

Thus, the column selection gate (which is formed by N channel MOS transistor GNT0) arranged corresponding to column selection line CSL00 is turned on, and data for memory cell MC which have been read between a bit line pair BL are transferred to local input/output line pairs LIO0 and LIO4. The data transferred to a local input/output line pair LIO0 are transferred to global input/output lines GIO00 and GIO01 through transfer gate TG00, whereas the data transferred to a local input/output line pair LIO4 are transferred to global input/output lines GIO10 and GIO11 through transfer gate TG41.

It is noted that although main blocks MBK0 and MBK4 were described as being simultaneously selected here, a similar effect can be obtained in the case where main blocks MBK1 and MBK5, MBK2 and MBK6 or MBK3 and MBK7 are simultaneously selected.

As described above, according to the first embodiment, global input/output line GIOj0 and GIOj1 (j=0–3) are arranged to cross between main blocks MBK3 and MBK4, and SD signal lines SDi0 (i=0–3), SDi1 (i=4–7) and SDi0 (i=4–7), SDi1 (i=0–3) are respectively arranged adjacent to global input/output lines GIOj0 (j=0–3) and GIOj1 (J=0–3). Thus, when main word lines respectively included in main blocks MBKi (i=0–3) and MBK (i+4) are simultaneously selected, global input/output lines GIOj0 (j=0–3) and GIOj1 (j=0–3) receive identical noises. As a result, the data signal transmitted between global input/output lines GIOj0 and GIOj1 (j=0–3) is not affected by noises.

In addition, as SD signal lines SDi0 and SDi1 (i=0–7) are arranged adjacent to global input/output lines GIOj0 and GIOj1 (j=0–3), global input/output lines GIOj0 and GIOj1 (j=0–3) are shielded by noises from other signal lines.

Modification of First Embodiment

Figure 5:
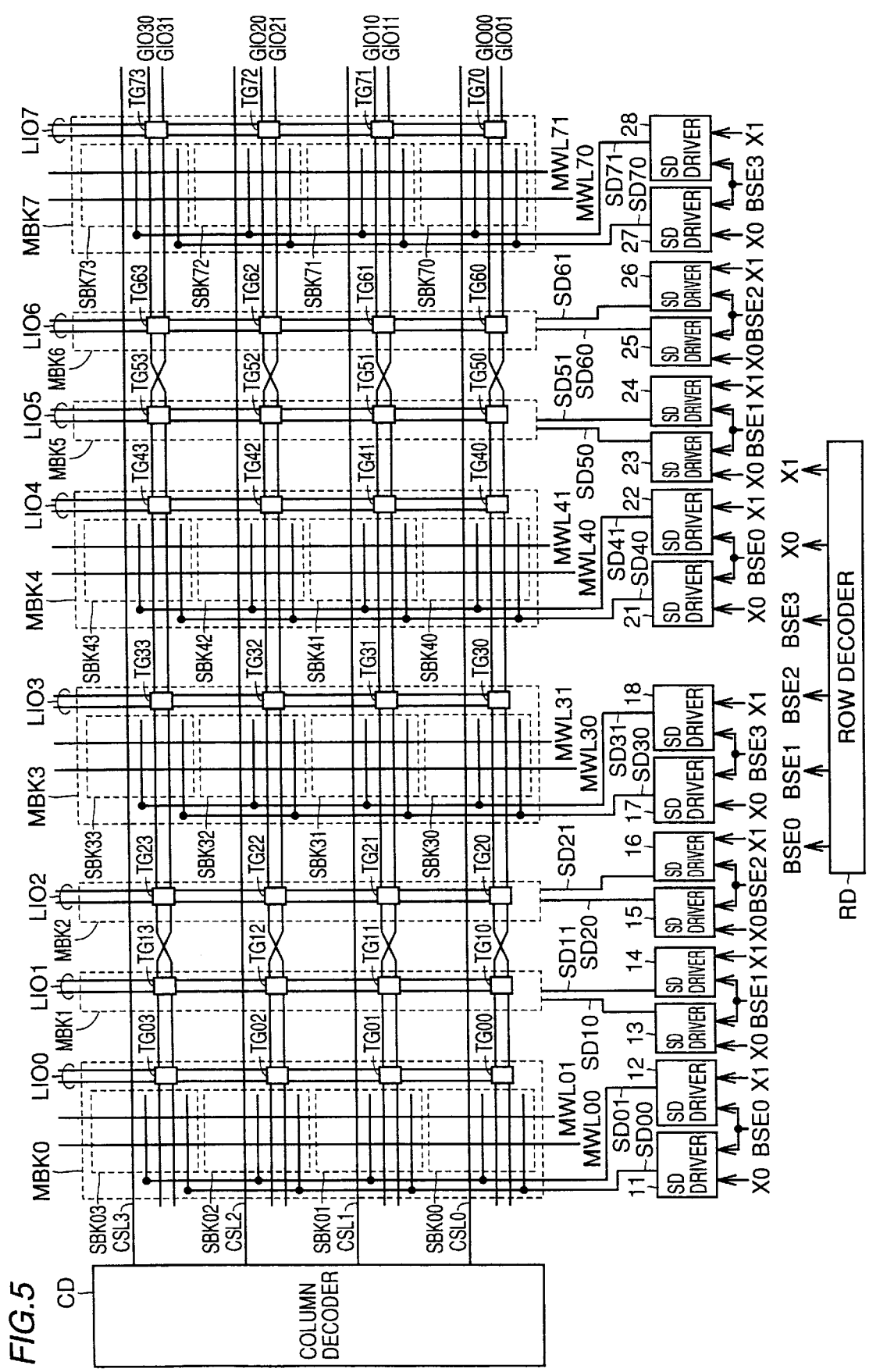
FIG. 5 is a block diagram showing an overall structure of a DRAM according to a modification of the first embodiment of the present invention.

Referring to FIG. 5, in the DRAM, global input/output lines GIOj0 and GIOj1 (j=0–3) are twisted at two points between main blocks MBK1 and MBK2 and between main blocks MBK5 and MBK6. Other parts of the structure are the same as those shown in FIG. 1.

An effect similar to that in the first embodiment can be obtained by arranging global input/output lines GIOj0 and GIOj1 as described above.

Second Embodiment

Figure 6:
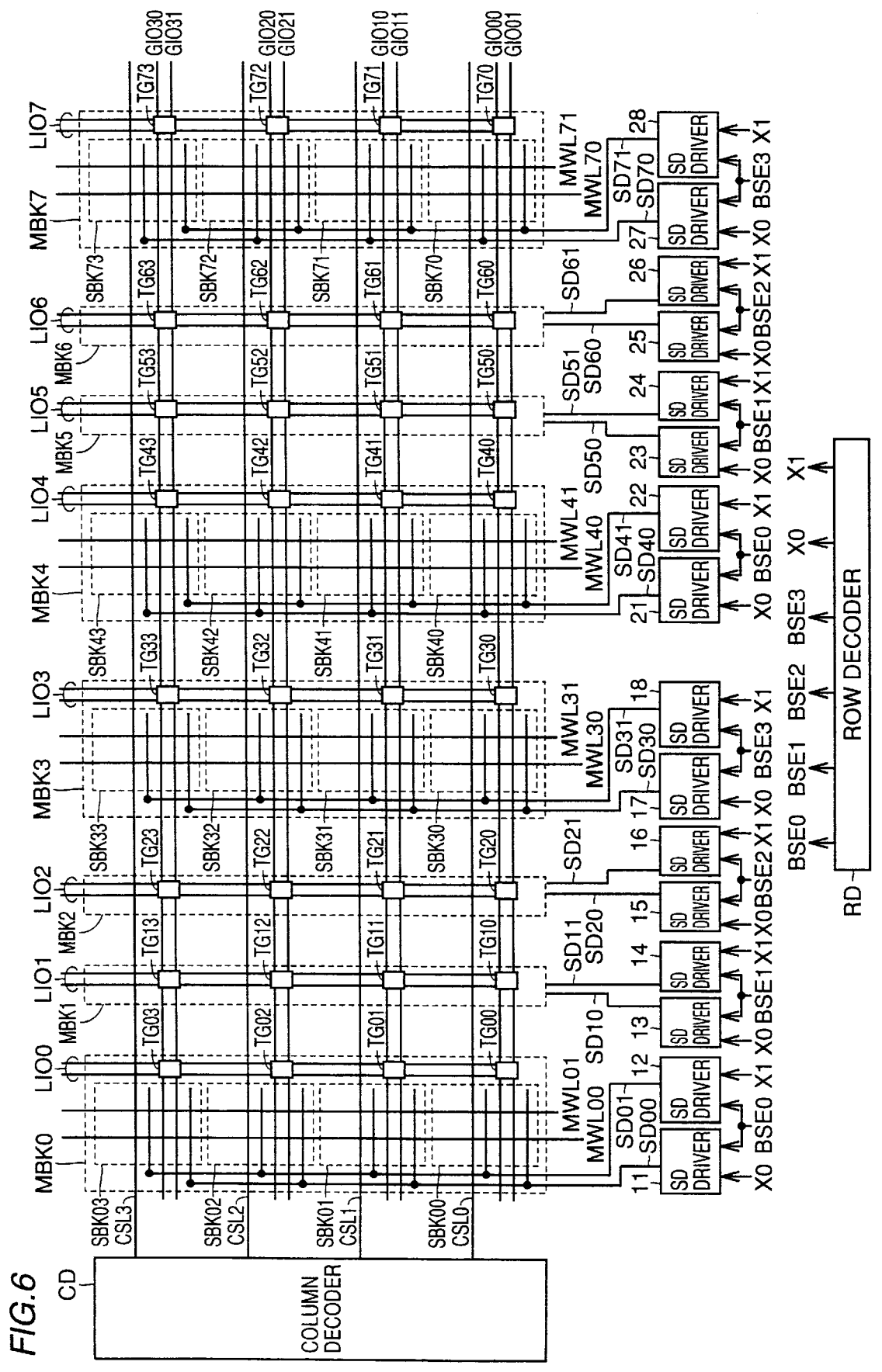

Referring to FIG. 6, in a DRAM, global input/output lines GIOj0 and GIOj1 (j=0–3) are arranged to traverse main blocks MBKi (i=0–7) without being twisted. SD signal lines SDi0 (i=4–7), SDi1 (i=0–3) and SDi0 (i=0–3), SDi1 (i=4–7) are respectively arranged adjacent to global input/output lines GIOj0 and GIOj1. Other parts of the structure are the same as those shown in FIG. 1.

As in the case of the first embodiment, when main word lines respectively included in main blocks MBKi (i=0–3) and MBK (i+4) are simultaneously selected, global input/output lines GIOj0 (j=0–3) and GIOj1 (j=0–3) receive identical noises. As a result, a data signal transmitted between global input/output lines GIOj0 and GIOj1 (j=0–3) is not affected by the noises.

Third Embodiment

Figure 7:
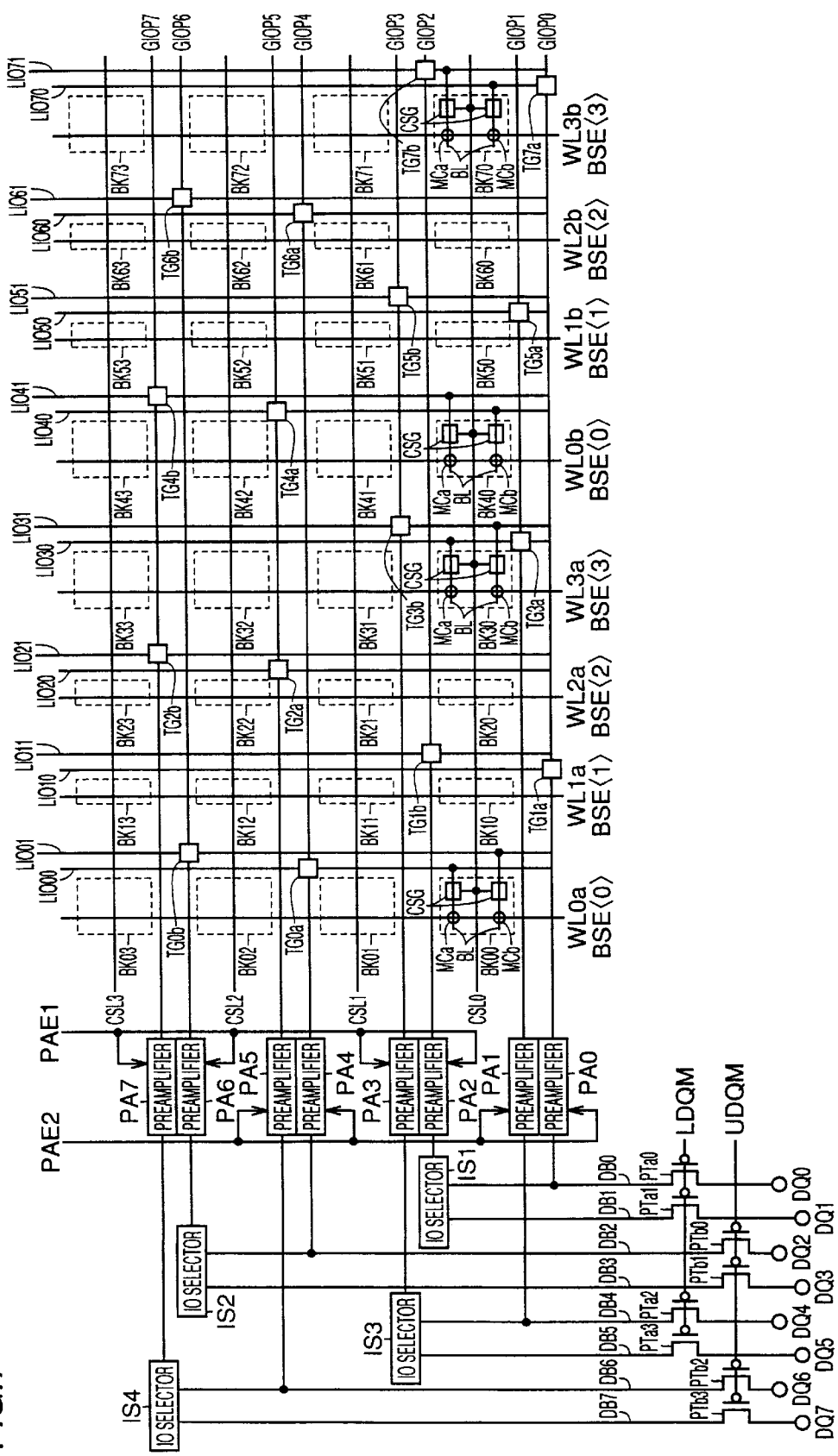
FIG. 7 is a block diagram showing an overall structure of a DRAM according to a third embodiment of the present invention.

Referring to FIG. 7, a DRAM includes memory blocks BKij (i=0–7, j=0–3), local input/output line pairs LIO10, LIO11 (i=0–7), global input/output line pairs GIOP0 to GIOP7, transfer gates TGia, TGib (i=0–7), word lines WLia, WLib (i=0–3), column selection lines CSL0 to CSL3, preamplifiers PA0 to PA7, IO selectors IS1 to IS4, P channel MOS transistors PTa0 to PTa3, and PTb0 to PTb3 and data input/output terminals DQ0 to DQ7.

Memory blocks BKij (i=0–7, j=0–3) are arranged in a matrix. Each of memory blocks BKij includes a plurality of memory cells (which are representatively denoted by MCa and MCb in FIG. 7) arranged in rows and columns, a plurality of word lines (which are representatively denoted by WLia and WLib (i=0–3) in FIG. 7) arranged in rows, a plurality of bit line pairs BL arranged in columns and a column selection gate CSG. Column selection gate CSL is arranged corresponding to a bit line pair BL and connected between a corresponding bit line pair BL and a local input/output line pair LIOi0 and LIOi1 (i=0–7).

It is noted that although memory blocks BK00, BK30, BK40 and BK70 are shown in FIG. 7, other memory blocks BKij also have similar structures.

Local input/output line pairs LIOi0 and LIOi1 (i=0–7) are connected to corresponding global input/output line pairs GIOPi (i=0–7) through transfer gates TGia and TGib.

Global input/output line pairs GIOP0 and GIOP1 are arranged adjacent to each other. Similarly, each of global input/output line pairs GIOP2 and GIOP3, GIOP4 and GIOP5, and GIOP6 and GIOP7 are arranged adjacent to each other.

Word lines WLia (i=0–3) are arranged longitudinally across memory blocks BKij (i=0–3, j=0–3). Word lines WLib (i=0–3) are arranged longitudinally across memory blocks BK (i+4) j (i=0–3, j=0–3). Column selection lines CSLj (j=0–3) are shared by memory blocks BKij (i=0–7) and turn on/off corresponding column selection gates CSG in response to column addresses. Preamplifiers PAi (i=0–7) are connected between corresponding global input/output line pairs GIOPi (i=0–7) and data buses DB0 to DB7 for amplifying data signals on global input/output line pairs GIOPi (i=0–7) and outputting them to a data bus in response to preamplifier activation signals PAE1 and PAE2. IO selector IS1 connects a global input/output line pair GIOP2 to data buses DB1 and DB0 when the data signal includes 8 and 4 bits, respectively. IO selector IS2 connects a global input/output line pair GIOP6 to data buses DB3 and DB2 when the data signal includes 8 and 4 bits, respectively. IO selector IS3 connects a global input/output line pair GIOP3 to data buses DB5 and DB4 when the data signal includes 8 and 4 bits, respectively. IO selector IS4 connects a global input/output line pair GIOP7 to data buses DB7 and DB6 when the data signal includes 8 and 4 bits, respectively. P channel MOS transistor PTa0 is connected between data bus DB0 and data input/output terminal DQ0 and turned on/off in response to a data mask signal LDQM.

P channel MOS transistor PTa1 is connected between data bus DB1 and data input/output terminal DQ1 and turned on/off in response to data mask signal LDQM. P channel MOS transistor PTa2 is connected between data bus DB4 and data input/output terminal DQ4 and turned on/off in response to a data mask signal LDQM. P channel MOS transistor PTa3 is connected between data bus DB5 and data input/output terminal DQ5 and turned on/off in response to data mask signal LDQM. P channel MOS transistor PTb0 is connected between data bus DB2 and data input/output terminal DQ2 and turned on/off in response to a data mask signal UDQM. P channel MOS transistor PTb1 is connected between data bus DB3 and data input/output terminal DQ3 and turned on/off in response to data mask signal UDQM. P channel MOS transistor PTb2 is connected between data bus DB6 and data input/output terminal DQ6 and turned on/off in response to data mask signal UDQM. P channel MOS transistor PTb3 is connected between data bus DB7 and data input/output terminal DQ7 and turned on/off in response to data mask signal UDQM.

Figure 8:
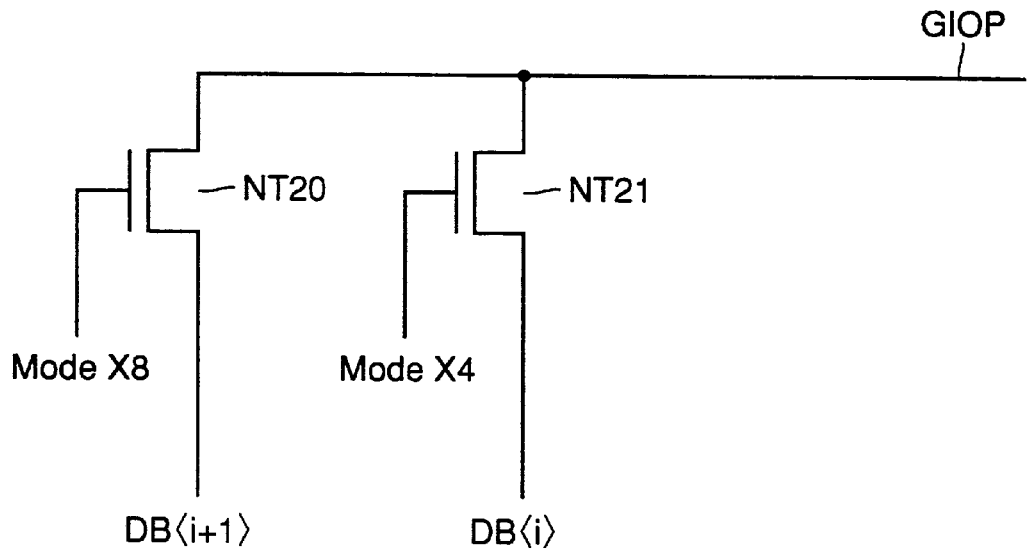
FIG. 8 is a circuit diagram showing a structure of an IO selector shown in FIG. 7.

FIG. 8 is a circuit diagram showing a structure of IO selectors IS1 to IS4 shown in FIG. 7. Referring to FIG. 8, each of IO selectors IS1 to IS4 includes N channel MOS transistors NT20 and NT21. N channel MOS transistor NT20 is connected between a corresponding global input/output line pair GIOP and a data bus DB (i+1) and turned on/off in response to a mode signal Mode×8. Mode signal Mode×8 attains to H and L levels when the data signal includes 8 and 4 bits, respectively. N channel MOS transistor NT21 is connected between a corresponding global input/output line pair GIOP and a data bus DBi and turned on/off in response to a mode signal Mode×4. Mode signal Mode×4 attains to H and L levels when the data signal includes 4 and 8 bits, respectively.

An operation of the IO selector having the above mentioned structure will be described in connection with IO selector IS1. When the data signal includes 8 bits, N channel MOS transistors NT20 and NT21 are respectively turned on and off. As a result, a global input/output line pair GIOP2 and a data bus DB1 are connected. When the data signal includes 4 bits, N channel MOS transistors NT20 and NT21 are respectively turned off and on. As a result, a global input/output line pair GIOP2 and a data bus DB0 are connected.

Figure 9:
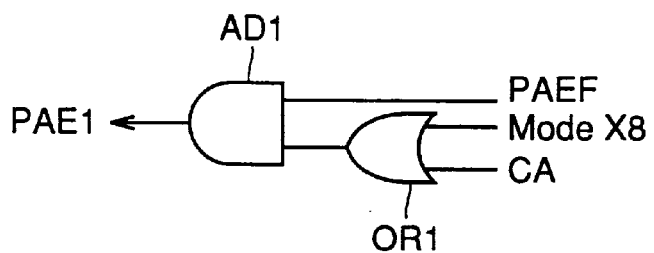
FIG. 9 is a block diagram showing a structure of a preamplifier activation signal generation circuit.

FIG. 9 is a diagram showing a structure of a preamplifier activation signal PAE1 generation circuit. Referring to FIG. 9, the preamplifier activation signal PAE1 generation circuit includes an OR circuit OR1 and an AND circuit AD1. OR circuit OR1 outputs an OR of mode signal Mode×8 and an upper bit of column address signal CA. AND circuit AD1 outputs an AND of a signal PAEF which attains to the H level after the column address is determined and an output from OR circuit OR1. An output from AND circuit AD1 turns to a preamplifier activation signal PAE1.

An operation of the preamplifier activation signal PAE1 generation circuit having the above mentioned structure will be described.

(a) in the case of 8 bits

Mode signal Mode×8 always attains to the H level. Thus, when signal PAEF attains to the H level, preamplifier activation signal PAE1 attains to the H level. In other words, preamplifier activation signal PAE1 does not depend on an upper bit of column address signal CA.

(b) in the case of 4 bits

Mode signal Mode×8 always attains to the L level. Thus, when signal PAEF is at the H level, preamplifier activation signal PAE1 changes in accordance with an upper bit of column address signal CA.

Figure 10:
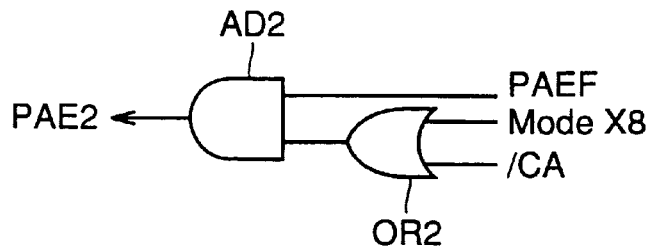
FIG. 10 is a block diagram showing a structure of a preamplifier activation signal generation circuit.
Figure 11:
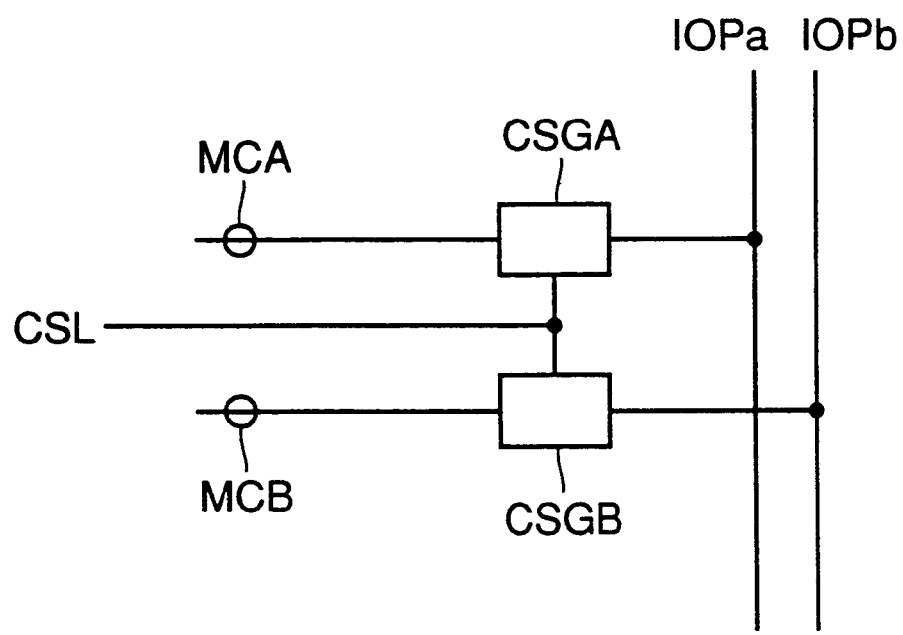
FIG. 11 is a block diagram showing a structure of a DRAM in which two input/output line pairs are arranged adjacent to each other.

FIG. 10 is a diagram showing a structure of a preamplifier activation signal PAE2 generation circuit. Referring to FIG. 10, the preamplifier activation signal PAE2 generation circuit includes an OR circuit OR2 and an AND circuit AD2. OR circuit OR2 outputs an OR of mode signal Mode×8 and an upper bit of column address signal CA. AND circuit AD2 outputs an AND of a signal PAEF, which attains to the H level after a column address is determined, and an output from OR circuit OR2. An output from AND circuit AD2 turns to a preamplifier activation signal PAE2.

Now, an operation of the DRAM having the above mentioned structure will be described for the cases of (1) 8 bits (×8) and (2) 4 bits (×4).

(1) in the case of 8 bits

Data buses DB1, DB3, DB5 and DB7 are respectively connected to global input/output line pairs GIOP2, GIOP6, GIOP3 and GIOP7 by IO selectors IS1 to IS4.

It is noted that data mask signals LDQM and UDQM are at the L level.

First, word lines WL0a to WL3a and WL0b to WL3b are selected by a row decoder (not shown) in response to a row address signal.

Thereafter, column selection line CSL0 is selected by a column decoder (not shown) in response to a column address signal. Thus, column selection gate CSG corresponding to column selection line CSL0 is turned on, and data for memory cells MCa and MCb in memory blocks BK00 to BK70 are respectively read to local input/output line pairs LIO00 to LIO70 and LIO01 to LIO71.

Transfer gate TG0a is turned on in response to the column address signal, and a local input/output line pair LIO00 and a global input/output line pair GIOP4 are connected. Similarly, transfer gate TG1a to TG7a are turned on, and corresponding pairs of local and global input/output lines are connected. On the other hand, transfer gates TG0b to TG7b are turned off, and local input/output line pairs LIO01 to LIO71 are not connected to the global input/output line pairs.

When a level of the column address signal is determined, preamplifiers PA0 to PA7 are activated, and bit signal of the data signals from data input/output terminals DQ0 to DQ7 are amplified by corresponding preamplifiers PA0 to PA7 and transferred to corresponding global input/output line pairs GIOP0 to GIOP7. The data signals are further transmitted to transfer gates TG0a to TG7a and local input/output line pairs LIO00 to LIO70 and written to memory cells MCa. On the other hand, the data for memory cells MCb read onto the local input/output line pairs LIO01 to LIO71 are again written directly.

In the above, data is written to memory cell MCa. When data is written to memory cell MCb, transfer gates TG0b to TG7b are turned on by the column address signal, and transfer gates TG0a to TG7a are turned off for an operation similar to that described above.

Now, masking of 4-bit data signal of 8-bit data signal by data mask signals LDQM and UDQM will be described.

When data mask signal LDQM attains to the H level, P channel MOS transistors PT0a to PT3a are turned off. Thus, data input/output terminals DQ0, DQ1, DQ4 and DQ5 are disconnected from corresponding data buses DB0, DB1, DB4 and DB5. As a result, write signals are not externally transmitted to global input/output line pairs GIOP0 to GIOP3.

When data mask signal UDQM attains to the H level, P channel MOS transistors PT0b to PT3b are turned off. Thus, data input/output terminals DQ2, DQ3, DQ6 and DQ7 are disconnected from corresponding data buses DB2, DB3, DB6 and DB7. As a result, write signals are not externally transmitted to global input/output line pairs GIOP4 to GIOP7.

As described above, in the third embodiment, the data signals corresponding to both of the two adjacent global input/output line pairs are masked, and the data signal corresponding to only one of two adjacent global input/output line pairs is not masked. The reason is as follows. Assume that, for example, only data signal corresponding to a global input/output line pair GIOP0 of two adjacent global input/output line pairs GIOP0 and GIOP1 is masked. When a strong write signal is externally transmitted to a global input/output line pair GIOP1, the data signal, which has been read from the memory cell, is on a global input/output line pair GIOP0. The data signal on a global input/output line pair GIOP0 may be inverted by the strong write signal which is supplied for a global input/output line pair GIOP1. In addition, the inverted data signal is written to the original memory cell again as being inverted. The data signal may be thus destroyed, and therefore the data signals corresponding to two adjacent global input/output line pairs are both masked or not masked. As a result, a signal which is transmitted to one of two adjacent global input/output line pairs will not destroy other data.

(2) in the case of 4 bits

Data buses DB1, DB3, DB5 and DB7 are respectively disconnected from global input/output line pairs GIOP2, GIOP6, GIOP3 and GIOP7 by IO selectors IS1 to IS4.

In other words, in the case of 4 bits, data input/output terminals DQ0, DQ2, DQ4 and DQ6 are employed.

It is noted that data mask signals LDQM and UDQM are at the L level.

The row decoder selects one of four word lines WL0a to WL3a or WL0b to WL3b in response to the row address signal. Here, assume that word lines WL0a to WL3a are selected.

Operations in the cases where (a) an upper bit of column address signal CA is at the H level and (b) an upper bit of column address signal CA is at the L level will be described.

(a) an upper bit of column address signal CA is at the H level

When the level of the column address signal is determined, preamplifier activation signal PAE1 attains to the H level, and preamplifiers PA2, PA3, PA6 and PA7 are activated.

On the other hand, as preamplifier activation signal PAE2 attains to the L level, preamplifiers PA0, PA1, PA4 and PA5 are inactivated. Thus, global input/output line pairs GIOP0, GIOP1, GIOP4 and GIOP5 are disconnected from data buses.

Successively, column selection line CSL0 is selected by a column decoder (not shown) in response to the column address signal. Thus, column selection gate CSG corresponding to column selection line CSL0 is turned on, and data for memory cells MCa and MCb in memory blocks BK00 to BK30 are respectively read to local input/output line pairs LIO00 to LIO30 and LIO01 to LIO31.

Transfer gate TG0b is turned on in response to the column address signal, and pairs of local and global input/output lines LIO01 and GIOP6 are connected. Similarly, transfer gates TG1b to TG3b are turned on, and corresponding local input/output line pairs LIO11, LIO21 and LIO31 are connected to the global input/output line pairs GIOP2, GIOP7 and GIOP3. On the other hand, transfer gates TG0a to TG3a are turned off, and local input/output line pairs LIO00 to LIO30 are not connected to the global input/output line pairs.

The data signals from data input/output terminals DQ0, DQ2, DQ4 and DQ6 are amplified by corresponding preamplifiers PA2, PA6, PA3 and PA7 and transferred to corresponding global input/output line pairs GIOP2, GIOP6, GIOP3 and GIOP7. The data signals are further transmitted to transfer gates TG0b to TG3b and local input/output line pairs LIO01 to LIO31 and written to memory cells MCb in memory blocks BK00 to BK30. On the other hand, the data for memory cells MCa which have been read on the local input/output line pairs LIO00 to LIO30 are again written directly.

(b) an upper bit of column address signal CA is at the L level

When the level of the column address signal is determined, preamplifier activation signal PAE2 attains to the H level, and preamplifiers PA0, PA1, PA4 and PA5 are activated.

On the other hand, as preamplifier activation signal PAE1 attains to the L level, preamplifiers PA2, PA3, PA6 and PA7 are inactivated. Thus, global input/output line pairs GIOP2, GIOP3, GIOP6 and GIOP7 are disconnected from data buses.

Thereafter, column selection line CSL0 is selected by a column decoder (not shown) in response to the column address signal. Thus, column selection gate CSG corresponding to column selection line CSL0 is turned on, and data for memory cells MCa and MCb in memory blocks BK00 to BK30 are respectively read to local input/output line pairs LIO00 to LIO30 and LIO01 to LIO31.

Transfer gate TG0a is turned on in response to the column address signal, and a local input/output line pair LIO01 and a global input/output line pair GIOP4 are connected. Similarly, transfer gates TG1a to TG3a are turned on, and corresponding local input/output line pairs LIO10, LIO20 and LIO30 are connected to global input/output line pairs GIOP0, GIOP5 and GIOP1. On the other hand, transfer gates TG0b to TG3b are turned off, and local input/output line pairs LIO01 to LIO31 are not connected to the global input/output line pairs.

The data signals from data input/output terminals DQ0, DQ2, DQ4 and DQ6 are amplified by corresponding preamplifiers PA0, PA4, PA1 and PA5 and transferred to corresponding global input/output line pairs GIOP0, GIOP4, GIOP1 and GIOP5. The data signals are further transmitted to corresponding transfer gates TG0a to TG3a and local input/output line pairs LIO00 to LIO30 and written to memory cells MCa in memory blocks BK0 to BK30. On the other hand, the data for memory cells MCb which have been read onto local input/output line pairs LIO01 to LIO31 are again written directly.

Now, masking of 2-bit data signal of 4-bit data signal by data mask signals LDQM and UDQM will be described.

When data mask signal LDQM attains to the H level, P channel MOS transistors PT0a to PT3a are turned off. Thus, data input/output terminals DQ0 and DQ4 are disconnected from corresponding data buses DB0 and DB4. As a result, write signals are not externally transmitted to global input/output line pairs GIOP0, GIOP2, GIOP1 and GIOP3.

When data mask signal UDQM attains to the H level, P channel MOS transistors PT0b to PT3b are turned off. Thus, data input/output terminals DQ2 and DQ6 are disconnected from corresponding data buses DB2 and DB6. As a result, write signals are not externally transmitted to global input/output line pairs GIOP4, GIOP6, GIOP5 and GIOP7.

As described above, the data signals corresponding to both of the two adjacent global input/output line pairs are masked, and the data signal corresponding to only one of two adjacent global input/output line pairs is not masked. The reason is the same as that described in the case of (1) 8-bits.

As in the foregoing, in the third embodiment, the data signals are externally transmitted or not transmitted using both of two adjacent global input/output line pairs, and the data signal is not externally transmitted to only one of two adjacent global input/output line pairs. As a result, a signal transmitted to one of two adjacent global input/output line pairs will not destroy other data.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device, comprising:

first and second main blocks;

a first global input/output line arranged to traverse said first and second main blocks; and a second global input/output line arranged adjacent to and in a complementary relation with said first global input/output line, each of said first and second main blocks including a plurality of sub blocks, a plurality of main word lines arranged longitudinally across said plurality of sub blocks, a local input/output line pair, and a transfer gate connected between said local input/output line pair and said first and second global input/output lines, each of said plurality of sub blocks including a plurality of memory cells arranged in rows and columns, a plurality of sub word lines arranged corresponding to said plurality of main word lines and in said rows, a plurality of sub word line drivers driving said plurality of sub word lines, a plurality of bit line pairs arranged in said columns, and a plurality of column selection gates arranged corresponding to said plurality of bit line pairs and each connected between said corresponding bit line pair and said local input/output line pair, said semiconductor memory device further comprising a row decoder substantially simultaneously selecting one of said plurality of main word lines included in said first main block and one of said plurality of main word lines included in said second main block, at least one of said sub block included in said first main block further including a first activation signal line arranged adjacent to said first global input/output line and transmitting a signal for activating said sub word line driver, and at least one of said sub blocks included in said second main block further including a second activation signal line arranged adjacent to said second global input/output line and transmitting a signal for activating said sub word line driver.

2. The semiconductor memory device according to claim 1, wherein said first and second global input/output lines are twisted between said first and second main blocks.

3. The semiconductor memory device according to claim 1, wherein said first and second global input/output lines linearly traverse said first and second main blocks.

4. A semiconductor memory device capable of switching between a first word configuration and a second word configuration shorter than said first word configuration, comprising:

a plurality of data input/output terminals;

a plurality of data input/output line pairs arranged corresponding to said plurality of data input/output terminals, two of said plurality of data input/output line pairs being adjacent to each other; and a word configuration switching circuit connecting each of said data input/output line pairs to said corresponding data input/output terminal in a case of said first word configuration and connecting each of adjacent two of said data input/output line pairs to one of said data input/output terminals in a case of said second word configuration.

5. The semiconductor memory device according to claim 4, further comprising a mask circuit connected between said data input/output terminal and said word configuration switching circuit and simultaneously masking data signals to be transmitted between said adjacent two data input/output lines pairs and said two corresponding data input/output terminals.

6. The semiconductor memory device according to claim 5, wherein said mask circuit includes:

a first transistor connected between one of said adjacent two data input/output line pairs and said corresponding data input/output terminal and turned on/off in response to a data mask signal; and a second transistor connected between the other of said adjacent two data input/output line pairs and said corresponding data input/output terminal and turned on/off in response to said data mask signal.

7. A semiconductor memory device, comprising:

first and second main blocks;

a first global input/output line arranged to traverse said first and second main blocks; and a second global input/output line arranged adjacent to and in a complementary relation with said first global input/output line, each of said first and second main blocks including a plurality of sub blocks, a plurality of main word lines arranged longitudinally across said plurality of sub blocks, a local input/output line pair, and a transfer gate connected between said local input/output line pair and said first and second global input/output lines, each of said plurality of sub blocks including a plurality of memory cells arranged in rows and columns, a plurality of sub word lines arranged corresponding to said plurality of main word lines and in said rows, a plurality of sub word line drivers driving said plurality of sub word lines, a plurality of bit line pairs arranged in said columns, and a plurality of column selection gates arranged corresponding to said plurality of bit line pairs and each connected between said corresponding bit line pair and said local input/output line pair, said semiconductor memory device further comprising a row decoder substantially simultaneously selecting one of said plurality of main word lines included in said first main block and one of said plurality of main word lines included in said second main block, at least one of said sub block included in said first main block further including a first signal line arranged adjacent to said first global input/output line and transmitting a signal earlier than said first global input/output line, and at least one of said sub blocks included in said second main block further including a second signal line arranged adjacent to said second global input/output line and transmitting a signal earlier than said second global input/output line.

* * * * *